(12) United States Patent
Hofer et al.

(10) Patent No.: US 12,155,246 B2
(45) Date of Patent: Nov. 26, 2024

(54) BATTERY SYSTEM

(71) Applicant: Samsung SDI Co., Ltd., Yongin-si (KR)

(72) Inventors: Maximilian Hofer, Hartberg (AT); Markus Pretschuh, Graz (AT); Michael Erhart, Seiersberg (AT)

(73) Assignee: SAMSUNG SDI CO., LTD., Yongin-si (KR)

( * ) Notice: Subject to any disclaimer, the term of this patent is extended or adjusted under 35 U.S.C. 154(b) by 400 days.

(21) Appl. No.: 17/480,011

(22) Filed: Sep. 20, 2021

(65) Prior Publication Data

US 2022/0006305 A1 Jan. 6, 2022

Related U.S. Application Data

(62) Division of application No. 16/367,015, filed on Mar. 27, 2019, now Pat. No. 11,451,072.

(30) Foreign Application Priority Data

Jul. 10, 2018 (EP) ..................................... 18182603
Nov. 7, 2018 (KR) ........................ 10-2018-0136028

(51) Int. Cl.
*H02J 7/00* (2006.01)
*G01R 31/3842* (2019.01)
(Continued)

(52) U.S. Cl.
CPC ........ *H02J 7/0031* (2013.01); *G01R 31/3842* (2019.01); *H01M 10/4207* (2013.01);
(Continued)

(58) Field of Classification Search
CPC .. H02J 7/0031; H02J 7/0047; G01R 31/3842; H01M 10/4207; H01M 10/425;
(Continued)

(56) References Cited

U.S. PATENT DOCUMENTS 6,771,188 B2 8/2004 Flick
6,915,192 B2 7/2005 Hashimoto et al.
(Continued)

FOREIGN PATENT DOCUMENTS

CN 202435069 U 9/2012
CN 104917215 A 9/2015
(Continued)

OTHER PUBLICATIONS

Extended European Search Report, European Application No. 18182603. 3, dated Jan. 24, 2019, 7 pages.
(Continued)

*Primary Examiner* — Zixuan Zhou
(74) *Attorney, Agent, or Firm* — LEWIS ROCA ROTHGERBER CHRISTIE LLP

(57) ABSTRACT

A control unit for a battery system includes a plurality of battery cells is provided. The control unit includes: an input node configured to receive a sensor signal indicative of a state of at least one of the plurality of battery cells; a microcontroller connected to the input node and configured to generate a first control signal based on the sensor signal; and a switch control circuit configured to control a power switch of the battery system by: receiving the sensor signal, the first control signal, and a fault signal indicative of an operational state of the microcontroller; generating a second control signal based on the sensor signal; and transmitting one of the first control signal and the second control signal to an output node of the control unit based on the received fault signal.

4 Claims, 5 Drawing Sheets

(51) Int. Cl.
*H01M 10/42* (2006.01)
*H01M 10/44* (2006.01)
*H01M 10/48* (2006.01)

(52) U.S. Cl.
CPC ....... *H01M 10/425* (2013.01); *H01M 10/441* (2013.01); *H01M 10/482* (2013.01); *H01M 10/486* (2013.01); *H02J 7/0047* (2013.01); *H01M 2010/4271* (2013.01); *H01M 2010/4278* (2013.01); *H01M 2220/20* (2013.01)

(58) Field of Classification Search
CPC ............. H01M 10/441; H01M 10/482; H01M 10/486; H01M 2010/4271; H01M 2010/4278; H01M 2220/20
USPC ........................................................ 320/134
See application file for complete search history.

(56) References Cited

U.S. PATENT DOCUMENTS

| | | | |
|---|---|---|---|
| 7,119,459 B2 | 10/2006 | Bruwer et al. | |
| 7,251,551 B2 | 7/2007 | Mitsueda et al. | |
| 7,453,235 B2 | 11/2008 | Blair et al. | |
| 7,683,576 B2 | 3/2010 | Tien et al. | |
| 8,004,238 B2 | 8/2011 | Kim et al. | |
| 8,018,702 B2 | 9/2011 | Maeda et al. | |
| 8,602,141 B2 | 12/2013 | Yee et al. | |
| 8,669,739 B2 | 3/2014 | Ohtomo | |
| 8,865,328 B2 | 10/2014 | Kim et al. | |
| 8,938,323 B2 | 1/2015 | Lee | |
| 9,000,718 B2 | 4/2015 | Park | |
| 9,030,167 B2 | 5/2015 | Yamaguchi et al. | |
| 9,054,538 B2 | 6/2015 | Kim | |
| 9,252,462 B2 | 2/2016 | Kim | |
| 9,255,957 B2 | 2/2016 | Arima et al. | |
| 9,397,370 B2 | 7/2016 | Nebrigic et al. | |
| 9,544,967 B2 | 1/2017 | Recker et al. | |
| 9,748,548 B2 | 8/2017 | Malcolm et al. | |
| 9,851,413 B2 | 12/2017 | Jeon | |
| 10,160,326 B2 | 12/2018 | Chung et al. | |
| 10,389,144 B2 | 8/2019 | Jin | |
| 10,804,717 B1 | 10/2020 | Gaide et al. | |
| 11,173,793 B2 | 11/2021 | Moriya et al. | |
| 2003/0085621 A1 | 5/2003 | Potega | |
| 2005/0228562 A1 | 10/2005 | Sayama et al. | |
| 2010/0209748 A1 | 8/2010 | Kudo et al. | |
| 2011/0001357 A1 | 1/2011 | Li et al. | |
| 2011/0169450 A1 | 7/2011 | Hudnall et al. | |
| 2012/0187887 A1 | 7/2012 | Sone | |
| 2014/0028098 A1 | 1/2014 | Trigiani | |
| 2014/0181541 A1 | 6/2014 | Matsumoto | |
| 2015/0120129 A1 | 4/2015 | Lee | |
| 2016/0207418 A1 | 7/2016 | Bergstrom et al. | |
| 2016/0226107 A1 | 8/2016 | Worry et al. | |
| 2016/0352131 A1 | 12/2016 | Nelson | |
| 2018/0186244 A1 | 7/2018 | Harvey et al. | |
| 2018/0212449 A1 | 7/2018 | Park et al. | |
| 2018/0254732 A1 | 9/2018 | Smolenaers | |
| 2018/0257506 A1 | 9/2018 | Thieme et al. | |
| 2019/0372381 A1 | 12/2019 | Hofer et al. | |
| 2020/0020992 A1 | 1/2020 | Hofer et al. | |
| 2020/0119574 A1 | 4/2020 | Wang et al. | |
| 2020/0195033 A1 | 6/2020 | Tajima | |
| 2020/0313458 A1 | 10/2020 | Moriya et al. | |
| 2021/0028503 A1 | 1/2021 | Hilligoss et al. | |
| 2021/0143486 A1 | 5/2021 | Kurcik et al. | |

FOREIGN PATENT DOCUMENTS

| | | | | |
|---|---|---|---|---|
| EP | 2782201 A1 | * | 9/2014 | .......... H01M 10/425 |
| EP | 2 897 250 A1 | | 7/2015 | |
| EP | 2 919 346 A1 | | 9/2015 | |
| JP | 2007-274866 A | | 10/2007 | |
| JP | 2016-93085 A | | 5/2016 | |
| WO | WO 2014/098875 A1 | | 6/2014 | |
| WO | WO 2018/231573 A1 | | 12/2018 | |
| WO | WO 2019/111878 A1 | | 6/2019 | |

OTHER PUBLICATIONS

Extended European Search Report issued in EP Application No. 19205225.6, dated May 4, 2020, 10 pages.
Restriction Requirement from USPTO for U.S. Appl. No. 16/367,015, mailed Jan. 8, 2021, 7 pages.
Office action from USPTO for U.S. Appl. No. 16/367,015, mailed Mar. 26, 2021, 15 pages.
Ex Parte Quayle action from USPTO for U.S. Appl. No. 16/367,015, mailed Jul. 9, 2021, 6 pages.
Notice of Allowance from USPTO for U.S. Appl. No. 16/367,015, mailed Sep. 17, 2021, 15 pages.
Office action from USPTO for U.S. Appl. No. 17/009,325, mailed Dec. 8, 2021, 8 pages.
Notice of Allowance from USPTO for U.S. Appl. No. 16/367,015, mailed Feb. 10, 2022, 5 pages.
Notice of Allowance from USPTO for U.S. Appl. No. 17/009,325, mailed Apr. 7, 2022, 16 pages.
Korean Office Action, with English translation, dated Nov. 24, 2022, issued in Korean Patent Application No. 10-2018-0136028 (22 pages).
U.S. Notice of Allowance dated Jun. 27, 2022, issued in U.S. Appl. No. 17/009,325 (8 pages).
European Communication pursuant to Article 94(3) EPC, for Patent Application No. 19 205 225.6, mailed May 23, 2022, 7 pages.
Notice of Allowance issued in U.S. Appl. No. 16/367,015, dated Jun. 2, 2022, 8 pages.

* cited by examiner

BATTERY SYSTEM

CROSS-REFERENCE TO RELATED APPLICATIONS

This application is a divisional of U.S. patent application Ser. No. 16/367,015, filed on Mar. 27, 2019, which claims priority to and the benefit of European Patent Application No. 18182603.3, filed in the European Patent Office on Jul. 10, 2018, and Korean Patent Application No. 10-2018-0136028, filed in the Korean Intellectual Property Office on Nov. 7, 2018, the entire content of all of which are incorporated herein by reference.

BACKGROUND

1. Field

Aspects of embodiments of the present invention relate to a battery system including an integrated redundant relay control for disconnecting the battery system from an external load. Additional aspects of embodiments of the present invention relate to a control unit for a battery system providing the redundant relay control and to a method for operating a battery system by using the control unit.

2. Description of the Related Art

A rechargeable or secondary battery differs from a primary battery in that it is designed to be repeatedly charged and discharged, while the latter is only designed for an irreversible conversion of chemical to electrical energy. Low-capacity rechargeable batteries are used as power supplies for small electronic devices, such as cellular phones, notebook computers, and camcorders, while high-capacity rechargeable batteries are used as power supplies for hybrid vehicles and the like.

In general, rechargeable batteries include an electrode assembly including a positive electrode, a negative electrode, and a separator interposed between the positive and negative electrodes, a case receiving (or accommodating) the electrode assembly, and an electrode terminal electrically connected to the electrode assembly. An electrolyte solution is injected into the case to enable charging and discharging of the battery via an electrochemical reaction between the positive electrode, the negative electrode, and the electrolyte solution. The shape of the case, for example, cylindrical or rectangular, etc., depends on the battery's intended purpose.

Rechargeable batteries may be a battery module including multiple battery submodules, each including battery cells coupled to each other in series and/or parallel to provide high energy density for, as one example, a hybrid vehicle. Such battery modules may be mechanically and electrically integrated, equipped with a thermal management system, and configured to communicate with each other and with one or more electrical consumers to form a battery system.

Static control of battery power output and charging may not be sufficient to meet the dynamic power demands of various electrical consumers connected to the battery system. Thus, steady or intermittent exchange of information between the battery system and the controllers of the electrical consumers may be used. This information may include the battery system's actual state of charge (SoC), potential electrical performance, charging ability, and internal resistance, as well as the consumers' actual or predicted power demands or surpluses.

For monitoring, controlling, and/or setting the aforementioned parameters, a battery system may include a battery management unit (BMU) and/or a battery management system (BMS). Such control units may be an integral part of the battery system and may be disposed within a common housing or may be part of a remote control unit communicating with the battery system via a suitable communication bus. In both cases, the control unit may communicate with the electrical consumers via a suitable communication bus, such as a controller area network (CAN) or serial peripheral interface (SPI).

The BMS/BMU may further communicate with each of the battery submodules, for example, with a cell supervision circuit (CSC) of each of the battery submodules. The CSC may be further connected to a cell connection and sensing unit (CCU) of one or more of the battery submodules that may interconnect the battery cells of the respective battery submodule.

A battery system may further include a protection system to provide voltage level control of a power interface of the battery system and to enable fast and reliable safety shutdown of the power interface in the event of non-permissible operating conditions. Such protection systems may be adapted to shut down (or cut off) a power connection between the battery system and an external terminal of the battery system. Generally, a protection system may include an electro-mechanical switch controlled by a microcontroller (MCU) of the battery system.

Typically, the microcontroller controlling such electro-mechanical switches is also configured to control other functions of the battery system. For example, the MCU may be part of the BMS/BMU of the battery system to provide further integration of the battery system, which reduces the battery system's material costs and the construction space requirements.

However, as battery systems' capacities increase, especially those used in partially electrically powered vehicles, the high voltage (HV) batteries increasingly supply power to security (and safety) relevant functions of the vehicle, such as steer-by-wire systems, autonomous driving systems, and/or crash prevention and mitigation systems. Thus, the availability and reliability of the HV batteries is becoming more important because they power security relevant functions. For example, some manufacturers already rank the availability of the HV batteries according to the automotive safety integrity level (ASIL) B standard.

A failure rate of the battery system should be sufficiently low to ensure safe operation. For example, for a battery system to meet the ASIL B standard, it must have a fit rate of 100 FIT ("failure in time", i.e., failures per $10^9$ h) or below. These specifications have been relatively difficult to achieve due to the microcontrollers generally utilized in the control units of battery systems, such as in MCU or System Basis Chip (SBS). For example, the MCU used in a common BMS/BMUs may have a fit rate of up to 2000 FIT and, accordingly, may not be approved under the ASIL B standard.

SUMMARY

One or more of drawbacks of the related art may be avoided or at least mitigated according to embodiments of the present invention. According to one embodiment of the present invention, a control unit for a battery system is provided, and the control unit includes an input node configured to receive a sensor signal, which is indicative of a state of at least one of a plurality of battery cells of the battery system. For example, the control unit is configured to monitor the state of the battery system by monitoring at least some of the battery cells. The sensor(s) supplying the sensor signal(s) is (are) part of either the control unit or the battery system. The input node may be configured for single-ended or differential input.

The control unit further includes a microcontroller that is connected to the input node and is configured to generate a first control signal based on the sensor signal. The first control signal is used to control a power switch, such as a relay, of the battery system in which the control unit is provided. In one embodiment, the first control signal is used to set the power switch into either a conductive or a non-conductive state by, for example, having one of two values. Thus, the microcontroller is configured to control the protection system of the battery system. The protection system may, for example, perform an overcurrent protection function. The sensor signal may refer to a current provided by the battery system. The microcontroller may provide further control functions with respect to the battery system. For example, in one embodiment, the microcontroller is also utilized as a BMS/BMU as described above.

In some embodiments, the control unit is also configured to perform a control function with respect to at least one, but up to all of, the battery cells of the battery system. The control functions relate to measurements of cell voltages, cell currents, cell resistances, or cell capacities. In some embodiments, the control functions also relate to the active or passive balancing of cell voltages or cell currents of a plurality of the battery cells. The control functions may further relate to data communication with the CSCs of the battery cells or battery submodules of the battery system and with electrical consumers.

The control unit may further include a switch control circuit configured to control a power switch of the battery system. The control unit may include an output node for supplying a control signal to the power switch. The control signal may be used to set the power switch into either a conductive or a non-conductive state. The control signal may be used to freely set the state (e.g., the conductivity state) of the power switch. For example, the switch control circuit may be configured to receive the first control signal from the microcontroller and the sensor signal from the input node.

The switch control circuit may be further configured to receive a fault signal that is indicative of an operation state (e.g., an operational state) of the microcontroller. In one embodiment, the fault signal is generated and output by (e.g., received from) the microcontroller itself. In other embodiments, the fault signal is generated and output by an additional circuit or component that is configured to monitor the microcontroller, such as a system basis chip (SBC).

The switch control circuit is further configured to generate a second control signal based on the sensor signal. The second control signal may be configured to control a power switch, for example, a relay, of the battery system in which the control unit is provided. In one embodiment, the second control signal is used to set the power switch into either a conductive or a non-conductive state by, for example, having one of two values. In other embodiments, the second control signal is configured to freely set the conductivity state of the power switch. In one embodiment, the second control signal is generated by comparing the sensor signal to a threshold value (e.g., a predetermined threshold value).

According to an embodiment of the present invention, the switch control circuit is configured to transmit one of the first control signal and the second control signal to an output node of the control unit based on the received fault signal. For example, the switch control circuit is configured to control the power switch via the output node by transmitting either the first control signal or the second control signal, which are both suitable to set the power switch into either a conductive or a non-conductive state. Thus, the switch control circuit, according to an embodiment of the present invention, provides two primary functions: (a) generating a second control signal in addition to a control signal generated by the microcontroller; and (b) multiplexing the first and second control signals.

The control unit provides a bypass to a microcontroller, which is commonly used to control a power switch for emergency shut-down of a battery system. Accordingly, the availability of the battery system is improved by decreasing the failure in time (FIT) rate of the battery system, particularly of the protection system of the battery system, by providing an alternative signal path between a security relevant sensor value and a power switch. The control unit allows automotive safety integrity level (ASIL) B classification of a battery system.

In one embodiment, the control unit further includes a front end circuit, such as an analog front end (AFE) circuit, that is connected to the input node and is configured to generate a state signal based on the sensor signal. In one embodiment, the state signal is equal to a sensor signal, which may be selected by a multiplexer. However, the front end circuit may include one or more of an analog amplifier, an operation amplifier, filters, and/or an analog-to-digital converter. Thus, the state signal may be a signal processed by the front end circuit having improved signal-to-noise (S/N) ratio and decreased disturbances and may be amplified with respect to a reference voltage (e.g., a predetermined reference voltage or a baseline voltage) or may be previously converted to a digital signal. Various front end circuits suitable for receiving different sensor signal inputs are generally known in the relevant art. When the front end circuit is part of the control unit, the sensor signal is replaced by the state signal downstream from the front end circuit. In the following embodiments, only a control unit including a front end circuit is described, but the present invention is not limited to this arrangement.

According to one embodiment, the switch control circuit is configured to transmit the first control signal to the output node (e.g., to the power switch) when the received fault signal is indicative of operability of the microcontroller (e.g., when the microcontroller is operable). In other words, during a normal mode of the microcontroller without a failure occurring therein, the microcontroller controls the power switch of the battery system. Thus, all functionalities and safety mechanisms, such as those with respect to a plurality of different sensor values (e.g., temperature, current, voltage, gas composition, etc.) may be utilized to control an emergency shut down of the battery system.

The switch control circuit may be configured to transmit the second control signal to the output node (e.g., to the power switch) when the fault signal is indicative of a malfunction of the microcontroller (e.g., when the microcontroller is malfunctioning). In other words, when a failure occurs in the microcontroller, the control of the power switch via the microcontroller is stopped and the power switch is instead controlled by the switch control circuit. Thus, even in a fault situation of the microcontroller, reliable emergency shut down of the battery system is provided. The control via the switch control circuit may be based on fewer sensor signals, for example, only current sensor signals.

The above-described embodiments provide a basic solution for controlling the power switch with the switch control circuit instead of by the microcontroller. In some embodiments, the switch control circuit may be configured to consider further input signals, such as signals indicative of an operational state of the vehicle or the battery system, signals indicative of environmental conditions, and/or signals indicative of an operational state of the switch control circuit, before switching the control signal. Further, time constants may be applied before switching the control signals from the first control signal to the second control signal. An exemplary embodiment of a battery system for an electric vehicle is described in more detail below.

According to another embodiment, the control unit further includes an amplification circuit that is interconnected between the front end circuit and the switch control circuit. In some embodiments, the amplification circuit is interconnected between at least one of the input nodes of the control unit and the switch control circuit. The switch control circuit may be further configured to generate the second control signal based on the amplified sensor signal. These embodiments allow the second control signal to be derived directly from the state signal or even from the sensor signal directly without any further amplification by the switch control circuit. Thus, amplifying the signal in the amplification circuit allows solely hardware components to be used without any additional programmable integrated circuits downstream from the amplification circuit. When the sensor signals are amplified, another bypass around the front end circuit is provided for when a failure of the microcontroller is due to a cause that also influences the front end circuit, such as electro-magnetic interference.

In one embodiment of the control unit, the switch control circuit is configured as a hardware path. For example, the switch control circuit does not include any programmable components or integrated circuits, such as ASICs or MCUs, but only includes relatively simple electronic hardware components, such as voltage dividers, transistors, resistors, capacitors, operational amplifiers, and/or electronic hardware components with comparable functionality and/or formed of the aforementioned components. Thus, the switch control circuit has relatively fast reaction and switching times with high reliability. For example, the switch control circuit may have a FIT rate of 100 or less. Further, the entire hardware path between the input nodes and the output node of the control unit is configured as a hardware path with a FIT rate of 100 or less. One skilled in the relevant art is aware of how to determine FIT rates of a hardware path based on the FIT rate of its components.

In one embodiment, the control unit further includes a system basis chip (SBC) that is configured to monitor the microcontroller. The system basis chip may be further configured to generate the fault signal and to transmit the fault signal to the switch control circuit. The system basis chip may be configured to generate a fault signal indicative of a malfunction of the microcontroller in response to detecting a malfunction of the microcontroller and to generate a fault signal indicative of an operability of the microcontroller otherwise. The system basis chip may be configured to perform additional functions, such as supervision functions, reset generators, watchdog functions, bus interface (LIN, CAN, etc.), wake-up logic, and/or power switches. Further, the power switch, which is controlled by the control unit, may be a relay. These embodiments further increase the reliability of the control unit and thereby increase protection of the battery system.

Another embodiment of the present invention relates to a battery system that includes a plurality of battery cells that are electrically connected in series between a first node and a second node, a power switch that is interconnected between the first node or the second node and at least one external load, and a control unit according to the above-described embodiments. The output node of the control unit is connected to the power switch to control the conductivity of the power switch. The battery system, according to an embodiment of the present invention, utilizes the positive effects provided by the control unit.

According to one embodiment of the present invention, the switch control circuit is configured to set the power switch into a non-conductive state after a first time period after receiving a fault signal indicating a malfunction of the microcontroller. In other words, the switch control circuit shuts off the battery system from any external load after a first time period (e.g., a fixed first time period) lapses after an error of the microcontroller has been detected. The shut off via the power switch occurs irrespective of any other signal inputs to the switch control circuit. Thus, when the switch control circuit detects a fault of the microcontroller, the switch control circuit may count (or start) the first time period for switching the power switch to a non-conductive state by starting a first timer. This functionality provides a reliable shut down mechanism for a microcontroller failure and, hence, allows for a low FIT rate and a high ASIL rating of a control unit according to embodiments of the present invention.

According to another embodiment of the present invention, the switch control circuit is configured to generate a second control signal that causes the power switch to be set to a non-conductive state when the sensor signal (e.g., the state signal) exceeds a threshold (e.g., a predetermined threshold). Therefore, the switch control circuit may include at least one comparator circuit or operational amplifier that receives the sensor signal (e.g., the state signal) as a first input and outputs the second control signal. The threshold may be supplied to the comparator or operational amplifier as a second input by an external signal or by an internal memory. Hence, the switch control circuit also provides sensor-based emergency shutdown of the power switch (and of the battery system). Such emergency shutdown is additional to the timer-based shutdown, for example, it may only occur during the first time period.

According to a further embodiment of the present invention, the switch control circuit is configured to set the power switch into a conductive state for a second time period after receiving a fault signal indicating a malfunction of the microcontroller. In other words, the switch control circuit generates and transmits a (third) control signal to set the power switch into a conductive state to the output node (e.g., the power switch) for a second time period (e.g., a fixed second time period) starting with the detection of an error of the microcontroller. The power switch may be set to a conductive state irrespective of any other signal inputs to the switch control circuit during the second time period. Thus, the sensor-based emergency shut-down of the switch control circuit is postponed during the second time period and a shut-down of the power switch (and of the battery system) is prevented.

These features allow for a transition phase between normal operation of the control unit and the battery system controlled by the MCU and an availability mode in which the control unit and the battery system are controlled by the switch control circuit after a fault of the microcontroller occurs and before a sensor-based emergency shutdown is realized by the switch control circuit. In some embodiments, the second time period is less than the fault tolerant time interval (FTTI) of the plurality of battery cells and/or less than the first time period. This ensures that the battery system reaches a safe state by applying the hardware-controlled sensor-based emergency shutdown by the switch control circuit within the fault tolerant time interval.

According to another embodiment, the battery system further includes at least one sensor that is configured to detect at least one of a current, a voltage, and a temperature of at least one of the plurality of battery cells as a sensor signal. In other words, the at least one sensor signal and/or the state signal is based on at least one of a voltage, a temperature, and a current of at least one of the plurality of battery cells. Further, the at least one sensor may include a shunt resistor connected in series with one of the first and second node. The control unit thus includes two input nodes for receiving a voltage drop over the shunt as sensor signal indicative of a battery current. The two input nodes may then be connected to the front end circuit and the switch control circuit.

Another embodiment of the present invention relates to a vehicle, such as an electric vehicle or hybrid vehicle, which includes at least one first electrical consumer electrically connected as an external load to a battery system according to the above-described embodiments. Hence, when a failure of the battery system's microcontroller occurs, an emergency shutdown of the first electrical consumer is controlled by the switch control circuit. Thus, the reliability of the battery system, particularly its emergency shutdown, is improved.

The vehicle may further include at least one second electrical consumer that is electrically connected to the battery system and that is not security relevant for the vehicle. The vehicle may further include a control unit that is configured to shut off the at least one second electrical consumer in response to receiving a fault signal indicative of a malfunction of the microcontroller. In one embodiment, the control unit may be a system basis chip of the battery system's control unit as described above. This embodiment allows the second electrical consumers of the vehicle to be immediately shut down upon recognition of a fault of the battery system's microcontroller. Particularly, high load consumers, such as the electric motor of the vehicle, are shut down as the second electrical consumer. Hence, a current drawn from the battery system is quickly reduced for safety reasons. Further, as the first electrical consumers are security relevant for the vehicle, controlling them by the hardware path switch control circuit as described above provides prolonged availability of the security relevant functions of the first electrical consumers.

The first time period, the second time period, and the sensor-based emergency shutdown as described above may be applied to the hardware control of the first electrical consumers after the microcontroller fault recognition. Thus, the security relevant functions of the first electrical consumers are provided during the first time period (e.g., a predetermined first time period), and a sensor based emergency shut-down is also provided during the first time period but not during the second time period in order to allow for a transition into the safe state.

Another embodiment of the present invention relates to a method for operating a battery system. The battery system includes a plurality of battery cells that are electrically connected in series between a first node and a second node, a power switch that is interconnected between the first node or the second node and at least one external load, and a control unit that is configured to control the power switch.

In a first step, at least one sensor of the battery system detects at least one sensor signal that is indicative of a state of at least one of the plurality of battery cells. This detection may occur during the entire operation time of the battery system, for example, during normal and availability mode. Further, the sensor signal may relate to at least one of a current, voltage, and temperature of at least one battery cell of the plurality of battery cells.

Then, a microcontroller of the control unit determines a first control signal for controlling the power switch based on the sensor signal. The first control signal is used to control the power switch as described above. This step is primarily performed during normal mode, that is, as long as no fault of the microcontroller occurs. However, in some embodiments, this step may be performed after a fault of the microcontroller has occurred.

The switch control circuit of the control unit receives the sensor signal and the first control signal as described above and a fault signal that is indicative of an operational state of the microcontroller. The fault signal may be received by the microcontroller itself or by another controller, such as a system basis chip, as described above. The switch control circuit then generates a second control signal based on the sensor signal, and the second control signal is used to control the power switch as described above. According to an embodiment of the preset invention, the switch control circuit transmits only one of the first control signal and the second control signal to the power switch via the output node of the control unit based on the received fault signal, for example, based on the value of the fault signal.

In some embodiments, the switch control circuit transmits the first control signal to the output node (e.g., to the power switch) when the received fault signal is indicative of an operability of the microcontroller. Further, the switch control circuit transmits the second control signal to the output node (e.g., to the power switch) when the fault signal is indicative of a malfunction of the microcontroller. Hence, during the normal mode without a failure occurring in the microcontroller, the microcontroller controls the power switch of the battery system, and when a failure occurs in the microcontroller, the control of the power switch via the microcontroller is stopped and the power switch becomes controlled solely by the switch control circuit.

Thus, in the normal mode, all functionalities and safety mechanisms with respect to a plurality of different sensor values (e.g., temperature, current, voltage, gas composition, etc.) may be utilized to control the emergency shut down of the battery system. However, even in a fault situation of the microcontroller, a reliable emergency shut down of the battery system is provided, even though it may be based on fewer sensor signals, such as only a current sensor value.

In one embodiment of the present method, a front end circuit of the control unit determines a state signal based on the sensor signal. The state signal is a processed sensor signal that is suitable for further processing by either the microcontroller or the switch control circuit as described in more detail above. When the front end circuit performs that step, the sensor signal in the method as described above is replaced by the state signal downstream from the front end circuit.

According to one embodiment, the method further includes at least one of the following steps performed by the switch control circuit of the control unit.

The switch control circuit may set the power switch to be in a non-conductive state after a first time period after receiving a fault signal indicating a malfunction of the microcontroller. Hence, a reliable emergency shut-down is provided even when a microcontroller fault occurs. The switch control circuit may set the power switch into a conductive state for a second time period (e.g., a predetermined second time period) after receiving a fault signal indicative of a malfunction of the microcontroller. The transmission of the first control signal occurs irrespective of the sensor signal and state signal. Hence, a transition period can be provided for transferring shut-down control form the microcontroller to the switch control circuit.

Further, the switch control circuit may generate, during the first time period, a second control signal that causes the power switch to be set into a non-conductive state when the state signal exceeds a threshold (e.g., a predetermined threshold). Hence, a sensor-based emergency shut-down is provided even after a fault of the microcontroller occurs and while the control of the power switch is performed solely by the switch control circuit.

Further aspects and features of embodiments the present invention will be learned from following description.

BRIEF DESCRIPTION OF THE DRAWINGS

Aspects and features of the present invention will become apparent to those of ordinary skill in the art by describing, in detail, exemplary embodiments thereof with reference to the attached drawings, in which.

DETAILED DESCRIPTION

Figure 1:
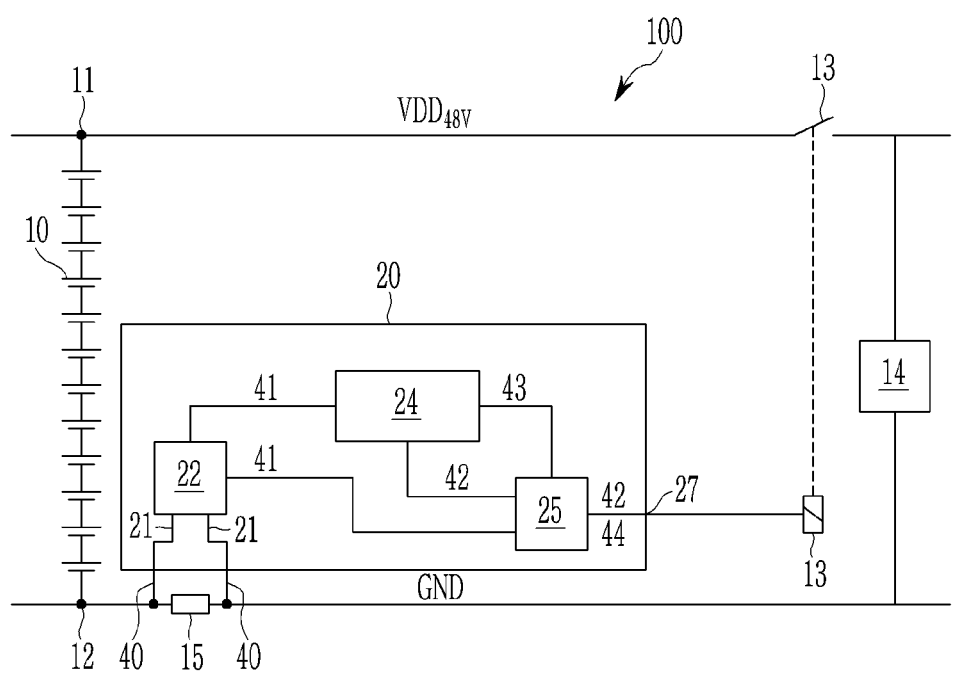
FIG. 1 illustrates a schematic view of a battery system according to an embodiment.

Reference will now be made, in detail, to embodiments, examples of which are illustrated in the accompanying drawings. Aspects and features of exemplary embodiments, and implementation methods thereof, will be described with reference to the accompanying drawings. The present invention, however, may be embodied in various different forms and should not be construed as being limited to the illustrated embodiments. Accordingly, processes, elements, and techniques that are not considered necessary to those having ordinary skill in the art for a complete understanding of the aspects and features of the present invention may not be described. Further, in the drawings, the relative sizes of elements, layers, and regions may be exaggerated for clarity, and like reference numerals denote like elements such that redundant descriptions thereof may be omitted.

It will be understood that, although the terms "first," "second," etc., are used to describe various elements, these elements should not be limited by these terms. These terms are used to distinguish one element from another element. For example, a first element may be named a second element and, similarly, a second element may be named a first element without departing from the scope of the present invention.

As used herein, the term "and/or" includes any and all combinations of one or more of the associated listed items. Further, the use of "may" when describing embodiments of the present invention refers to "one or more embodiments of the present invention." In the following description of embodiments of the present invention, the terms of a singular form may include plural forms unless the context clearly indicates otherwise. Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

As used herein, the terms "substantially," "about," and similar terms are used as terms of approximation and not as terms of degree and are intended to account for the inherent deviations in measured or calculated values that would be recognized by those of ordinary skill in the art. Further, if the term "substantially" is used in combination with a feature that could be expressed as a numeric value, the term "substantially" denotes a range of +/−5%.

FIG. 1 illustrates a schematic view of a battery system 100 according to an embodiment of the present invention. The battery system 100 includes a plurality of battery cells 10 that are connected to each other in series between a first node 11 and a second node 12. The battery cells 10 may also be connected to each other in parallel between the first node 11 and the second node 12, thereby forming an XsYp configuration between the first and second nodes 11, 12. Further, battery submodules may be connected between the first and second nodes 11, 12 (e.g., the battery cells 10 may be arranged into battery submodules between the first and second nodes 11, 12).

Each of the twelve battery cells 10 provides a voltage of approximately 4 V, such that a voltage VDD of approximately 48 V is applied between the first node 11 and the second node 12. An external load 14 is supplied with this voltage (e.g., with the VDD of approximately 48V) of the battery cells 10. A relay 13 is interconnected as a power switch between the first node 11 and the external load 14 for controlling the power supply to the external load 14. The conductivity state of the relay 13 is controlled by a control unit (e.g., a controller) 20 via an output node 27 of the control unit 20.

The control unit 20 may include at least one input node for receiving sensor inputs. For example, as shown in FIG. 1, the control unit 20 includes two input nodes 21 configured to receive differential inputs. These input nodes 21 are connected upstream and downstream, respectively, of ends of a shunt resistor 15 that is interconnected between the second node 12 and the external load 14. Hence, the input nodes 21 receive (or measure) a voltage drop over the shunt resistor 15 as a sensor signal 40 (e.g., the input nodes 21 measure the voltage drop over the shunt resistor 15 and output the measured voltage drop as the sensor signal 40).

The control unit 20 further includes a front end circuit 22 for receiving and processing the sensor signal 40 in order to generate a state signal 41 based on the sensor signal 40. In one embodiment, the state signal 41 is indicative of a current I provided by the plurality of battery cells 10 and is generated by utilizing a known value of the resistance R of the shunt resistor 15.

The control unit 20 further includes a microcontroller 24 that is connected to the front end circuit 22 and receives the state signal 41 from the front end circuit 22. The microcontroller 24 is further configured to generate a first control signal 42 based on the state signal 41. The first control signal 42 is used to set the relay 13 into either a conductive or a non-conductive state. For example, the microcontroller 24 generates a first control signal 42 that sets the relay 13 into the conductive state when the state signal 41 indicates a current within the standard operation conditions of the battery system 100, and the microcontroller 24 generates a first control signal 42 that sets relay 13 into the non-conductive state when the state signal 41 indicates an overcurrent.

The microcontroller 24 further generates and outputs a fault signal 43 that is indicative of an operational state of the microcontroller 24. In one embodiment, the fault signal 43 is based on self-testing of the microcontroller 24 and/or is based on internal error codes that occur more than sporadically. The fault signal 43 is either indicative of an operability of the microcontroller 24 (e.g., that the microcontroller 24 is operating properly) or of a malfunction of the microcontroller 24. The fault signal may have one of two possible values, such as "0" or "1".

The control unit 20 further includes a switch control circuit 25 that is connected to the front end circuit 22 and the microcontroller 24. The switch control circuit 25 receives the state signal 41 as an input from the front end circuit 22. The switch control circuit 25 also receives the first control signal 42 and the fault signal 43 from the microcontroller 24. The switch control circuit 25 is further connected to the output node 27 of the control unit 20.

The switch control circuit 25 is configured to generate a second control signal 44 based on the received state signal 41. The second control signal 44 is used to set the relay 13 into either a conductive or a non-conductive state. The switch control circuit 25 generates a second control signal 44 that sets the relay 13 into the conductive state when the state signal 41 indicates a current within standard operational conditions of the battery system 100 and generates a second control signal 44 that sets relay 13 in the non-conductive state when the state signal 41 indicates overcurrent. To this end, the second control signal 44 may be different than (e.g., may be a different signal than) the first control signal 42.

The switch control circuit 25 outputs either the first control signal 42 or the second control signal 44 to the relay 13 via the output node 27. The switch control circuit 25 outputs one of these signals 42, 44 through to the output node 27 based on the fault signal 43. Based on the value of the fault signal 43, for example, whether it is indicative of an operability or a malfunction of the microcontroller 24, the switch control circuit 25 selects one of the first and second control signal 42, 44 and outputs the selected control signal 42, 44 to the relay 13 via the node 27. Thus, the control unit 20 allows for continued control of the relay 13 based on the sensor signal 40 even when the microcontroller 24 has a malfunction and can no longer reliably control the relay 13.

Figure 2:
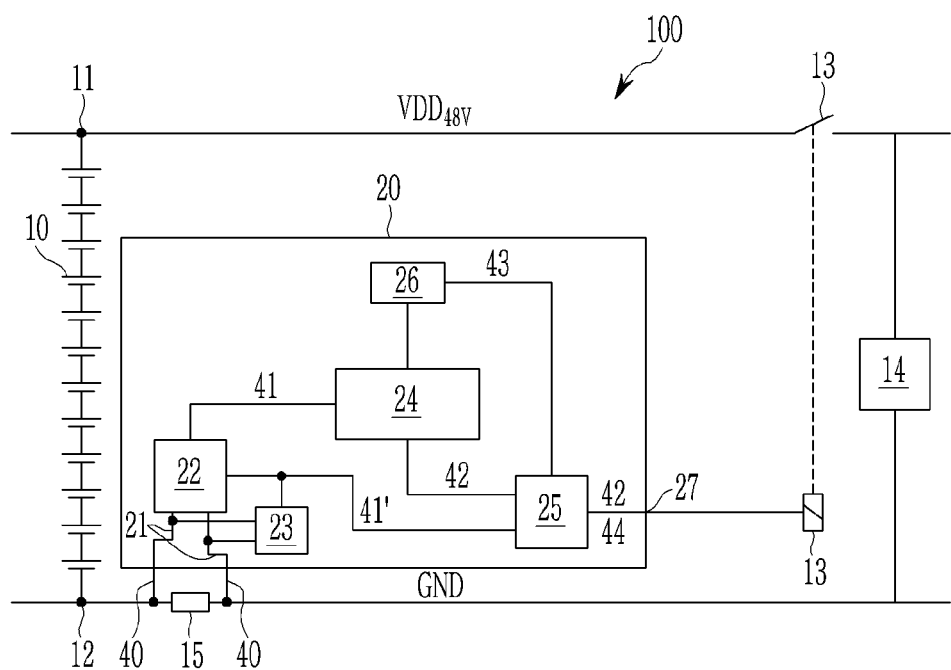
FIG. 2 illustrates a schematic view of a battery system according to an embodiment.

FIG. 2 illustrates a schematic view of a battery system 100 according to a second embodiment. The control unit 20 of the battery system 100 shown in FIG. 2 differs from that of the first embodiment, whereas all other components are the same or substantially the same.

The control unit 20 of the second embodiment differs from that of the first embodiment in that it further includes an amplification circuit 23 that is interconnected between the input node 21 and the conductive connection between the front end circuit 22 and the switch control circuit 25. The amplification circuit 23 provides a bypass of the front end circuit 22 and further allows the amplified sensor signal 41' to be supplied to the switch control circuit 25. Hence, the hardware path of the control unit 20 between the input nodes 21 and the output node 27 via the switch control circuit 25 is also independent of the operability of the front end circuit 22.

The control unit 20 of the second embodiment further differs in that it includes a system basis chip (SBC) 26 that is connected to the microcontroller 24 and the switch control circuit 25. The system basis chip 26 is configured to monitor an operational state of the microcontroller 24 and to generate and output a fault signal 43 that is indicative of an operability of the microcontroller 24. The system basis chip 26 may also have typical functionalities of an SBC. When the microcontroller 24 cannot provide a reliable fault signal 43, which may cause a serious malfunction, the system basis chip 26 may further improve the reliability of the control unit 20 by generating the fault signal 43 instead of the microcontroller 24.

Figure 3:
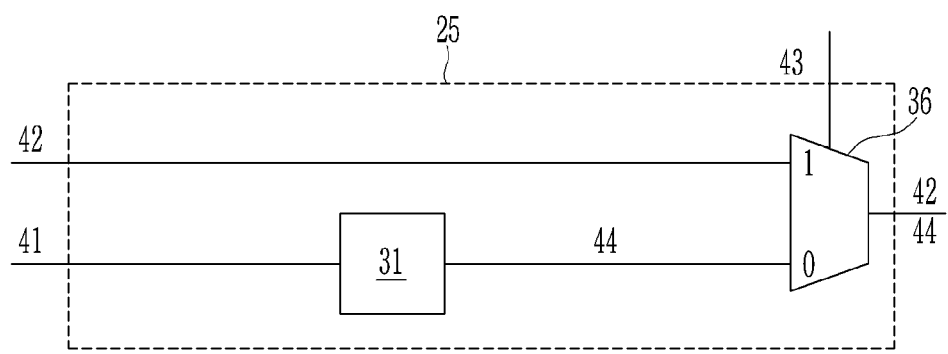
FIG. 3 illustrates a schematic view of a switch control circuit according to an embodiment.

FIG. 3 illustrates a schematic view of a switch control circuit 25. The switch control circuit 25 may be part of the control unit 20 according to the first or second embodiment. The switch control circuit 25 provides the core functionalities of this circuit with a relatively simple design.

The switch control circuit 25 includes a multiplexer 36 and a comparator 31. The comparator 31 is configured to compare the state signal 41 (or the amplified sensor signal 41') with a threshold (e.g., a predetermined threshold). The comparator 31 may include a further input for receiving the threshold. The comparator 31 outputs a second control signal 44 that reflects whether or not the state signal 41 (or the amplified sensor signal 41') exceeds the threshold.

The multiplexer 36 has two data signal inputs and one control signal input. The first control signal 42 is supplied to a first data signal input of the multiplexer 36, and the output of the comparator 31 is supplied to a second data signal input of the multiplexer 36. The fault signal 43 is supplied to the control signal input of the multiplexer 36. The multiplexer 36 outputs one of the first and second control signal 42, 44 based on the value of the received fault signal 43.

Figure 4:
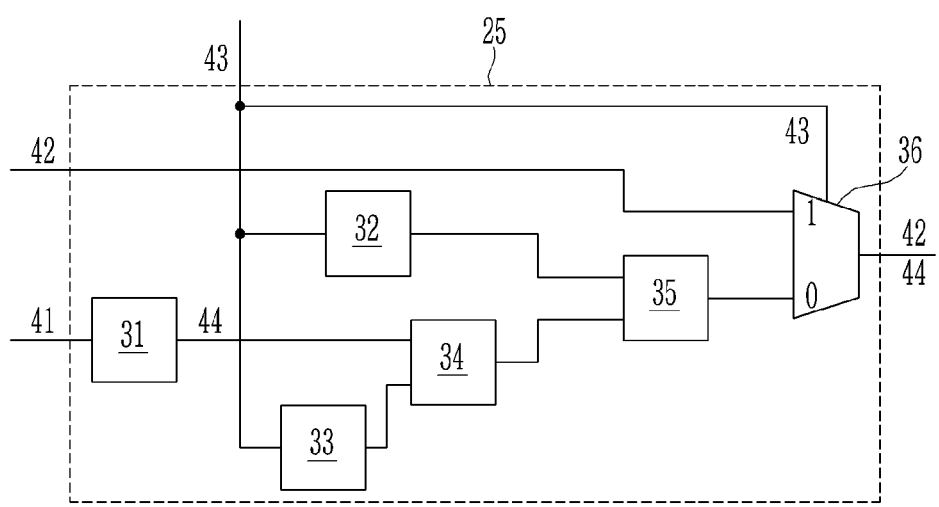
FIG. 4 illustrates a schematic view of a switch control circuit according to an embodiment.
Figure 5:
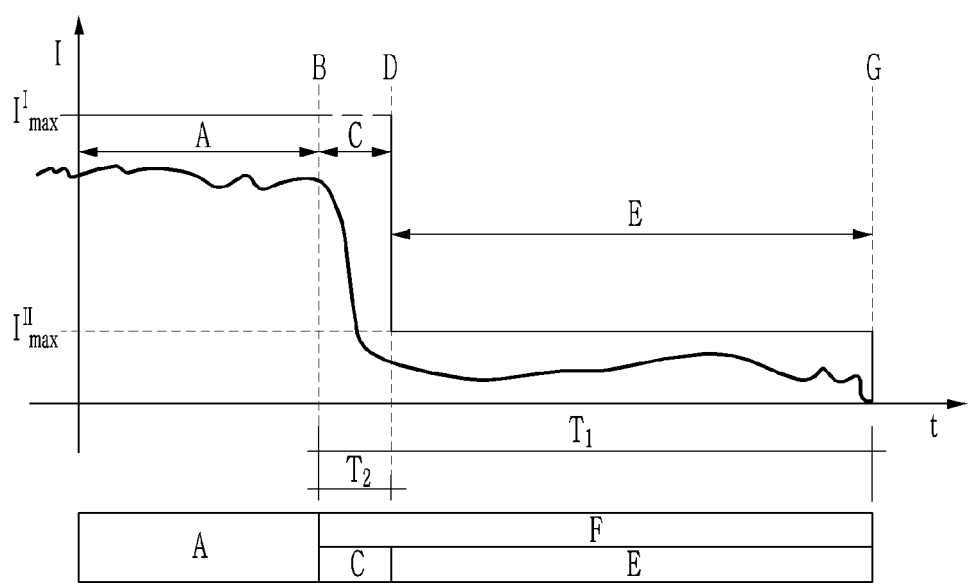
FIG. 5 illustrates a timeline of a current of a battery system according to an embodiment.

FIG. 4 illustrates a schematic view of a switch control circuit 25 according to another embodiment. The switch control circuit 25 may be part of the control unit 20 according to the first or second embodiment. The switch control circuit 25 shown in FIG. 4 provides the core functionalities of this circuit and further functionalities related to the first time period and the second time period as described above. The operation of the switch control circuit 25 according to this embodiment is described with reference to the timeline of an output current of battery system 100 as shown in FIG. 5.

The switch control circuit 25 according to this embodiment receives the state signal 41 (or the amplified sensor signal 41'), the first control signal 42, and the fault signal 43 as inputs.

During a normal operation mode A (see, e.g., FIG. 5) of the battery system 100 and the control unit 20, the microcontroller 24 operates without fault and a maximum current $I^F_{max}$ is allowed to be provided by the battery system 100. During the normal operation mode, the fault signal 43 is indicative of the operability of the microcontroller 24 and has the binary value "1". The fault signal 43 is supplied to the multiplexer 36 as the control signal input and sets the data signal input of the multiplexer 36 to the first data signal input 1, which corresponds to the first control signal 42 that is supplied from the microcontroller 24. Hence, during the normal operation mode A, the first control signal 42 is output to the relay 13 via the multiplexer 36 and the output node 27, and thus, the relay 13 is controlled by the microcontroller 24. The microcontroller 24 sets the relay 13 into a non-conductive state via the first control signal 42 when the state signal 41 indicates a current that exceeds $I^I_{max}$.

At time point B (see, e.g., FIG. 5), a failure occurs in the microcontroller 24, and the failure is immediately realized by the microcontroller 24 itself (see, e.g., FIG. 1) or by the system basis chip 26 connected to the microcontroller 24 (see, e.g., FIG. 2). Hence, from the time point B, the fault signal 43 is indicative of a malfunction of the microcontroller 24 and has the value "0". Thus, the control signal input of the multiplexer 36 is set to the second data signal input 0 via the fault signal 43.

Further, at the time point B, at least one second electrical consumer of an electric vehicle that is supplied by (e.g., powered by) the battery system 100 and is not security relevant for the electric vehicle is disconnected from the battery system 100 via a control unit, which may be the system basis chip 26 shown in FIG. 2. Hence, as shown in FIG. 5, the current 1 (curved line) starts dropping from the time point B in order to increase the safety of the electric vehicle.

The second data signal input 0 of multiplexer 36 is connected to the state signal 41 (or the amplified sensor signal 41') by a hardware path described in more detail below. In the control unit 20 as illustrated in FIG. 4, the relay 13 is set into the conductive state as long as it receives a high signal "1" via the output node 27.

As a part of said hardware path, the second data signal input of multiplexer 36 is connected to the fault signal 43 via an OR gate 35 and a first latching element 32. The first latching element 32 receives the fault signal 43 as an input and transmits an output to the OR gate 35. The first latching element 32 latches a high input signal supplied thereto for a second time period $T_2$ (e.g., a predetermined second time period). As the value of the fault signal 43 changes from high to low at time point B of FIG. 5, the first latching element 32 outputs a high value "1" to a first input of the OR gate 35 until the second time period $T_2$, which starts at the time point B, lapses. The OR gate 35 outputs a high value "1" as long as a single input provided thereto is high and, thus, provides a high signal "1" to the second date signal input 0 of the multiplexer 36 until the second time period $T_2$, which starts at the time point B, lapses.

As illustrated in FIG. 5, during the second time period $T_2$, for example, during initial mode C, the current drops below a second current threshold $I^{II}_{max}$ due to cutting the security irrelevant second electrical consumers off from the battery system 100. During the initial mode C, threshold based control of the relay 13 does not occur in order to reduce the current consumption below $I^{II}_{max}$ while preventing (or reducing the risk of) a premature shut down of the battery system 100 via the relay 13.

After the second time period $T_2$ lapses, which started at the time point B, the first latching element 32 no longer provides a high signal "1" to the first input of the OR gate 35. Thus, whether or not the OR gate 35 outputs a high signal "1" to the multiplexer 36 solely depends on the signal applied to a second input of the OR gate 35. The second input of the OR gate 35 receives an output signal of an AND gate 34, the inputs of which are described below.

A second input of the AND gate 34 is connected to the fault signal 43 via a second latching element 33. The second latching element 33 latches a high input signal supplied thereto for a first time period $T_1$ (e.g., a predetermined first time period $T_1$). As the value of the fault signal 43 changes from high to low at the time point B of FIG. 5, the second latching element 33 outputs a high value "1" until the lapse of the first time period $T_1$, which started at the time point B. Thus, at the end of the first time period $T_1$, for example, at point G illustrated in FIG. 5, the second latching element 33 outputs a low signal "0" to the AND gate 34, and thus, the AND gate 34 also outputs a low signal "0" to the multiplexer 36. Hence, at the point G, the availability mode of the battery system 100 that started with the fault at time point B ends and the battery system 100 is inevitably shut down by setting the relay 13 into a non-conductive state.

A first input of the AND gate 34 is connected to the comparator 31, as described above with respect to FIG. 3, and the comparator 31 receives the state signal 41 (or the amplified sensor signal 41') and outputs a second control signal 44 based on a comparison between the signal 41 or 41' and a threshold (e.g., a predetermined threshold). The comparator 31 outputs a high signal "1" when the state signal 41 (or the amplified sensor signal 41') indicates a current below threshold current $I^{II}_{max}$ as illustrated in FIG. 5 and outputs a low signal "0" when the state signal 41 (or the amplified sensor signal 41') indicates a current above threshold current $I^{II}_{max}$ as illustrated in FIG. 5.

Hence, during the first time period $T_1$ and after the lapse of the second time period $T_2$, for example, between the points D and G or during low-performance mode E as illustrated in FIG. 5, sensor-based control of the relay 13 is performed in order to provide overcurrent protection, whereas the overcurrent is lowered from $I^I_{max}$ to $I^{II}_{max}$. In other words, during the low-performance mode E, the battery system 100 is shut down via the relay 13 when the state signal 41 (or the amplified sensor signal 41') indicates a current above the threshold current $I^{II}_{max}$.

The latching times of the latching elements 32 and 33 (e.g., the first time period $T_1$ and the second time period $T_2$), may be counted by timers. The timers for counting the first time period $T_1$ and the second time period $T_2$ may be started at the time when a fault of the microcontroller 24 is recognized.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. The electrical connections or interconnections described herein may be realized by wires or conducting elements, e.g., on a PCB or another kind of circuit carrier. The conducting elements may include metallization, for example, surface metallization and/or pins, and/or may include conductive polymers or ceramics. Further, electrical energy may be transmitted via wireless connections, for example, by using electromagnetic radiation and/or light.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like.

Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

SOME REFERENCE NUMERALS 10 battery cell
11 first node of battery system
12 second node of battery system
13 power switch (relay)
14 external load
15 sensor (shunt resistor)
20 control unit
21 input node
22 front end circuit
23 amplification circuit
24 microcontroller
25 switch control circuit
26 system basis chip
27 output node
31 comparator circuit
32 first latching element
33 second latching element
34 "AND" gate
35 "OR" gate
36 multiplexer
40 sensor signal
41 state signal
42 first control signal
43 fault signal
44 second control signal

What is claimed:

1. A control unit for a battery system comprising a plurality of battery cells, the control unit comprising:
    an input node configured to receive a sensor signal indicative of a state of at least one of the plurality of battery cells;
    a microcontroller connected to the input node and configured to generate a first control signal based on the sensor signal; and
    a switch control circuit configured to control a power switch of the battery system by:
        receiving the sensor signal from the input node and receiving one of the first control signal and a fault signal from the microcontroller indicative of an operational state of the microcontroller;
        generating a second control signal based on the sensor signal;
        transmit the first control signal to an output node of the control unit when the fault signal indicates the microcontroller is operative; and
        transmit the second control signal to the output node when the fault signal indicates the microcontroller is malfunctioning.

2. The control unit according to claim 1, further comprising a front end circuit interconnected between the input node and the microcontroller and configured to generate a state signal based on the sensor signal,
    wherein the microcontroller is configured to generate the first control signal based on the state signal, and
    wherein the switch control circuit is configured to receive the state signal and to generate the second control signal based on the state signal.

3. The control unit according to claim 2, further comprising an amplification circuit interconnected between at least two of the input node, the front end circuit, and the switch control circuit,
    wherein the switch control circuit is configured to generate the second control signal based on the state signal.

4. The control unit according to claim 1, wherein the switch control circuit is a hardware path with a failure-in-time (FIT) rate of 100 or less.

* * * * *